United States Patent [19]

Hefner, Jr. et al.

[11] Patent Number: 4,471,101

[45] Date of Patent: Sep. 11, 1984

[54] NORBORNYL MODIFIED POLYESTERAMIDES AND PROCESS FOR PREPARING SAME

[75] Inventors: Robert E. Hefner, Jr.; James C. Uroda, both of Lake Jackson, Tex.

[73] Assignee: The Dow Chemical Company, Midland, Mich.

[21] Appl. No.: 548,746

[22] Filed: Nov. 4, 1983

Related U.S. Application Data

[63] Continuation of Ser. No. 465,727, Feb. 11, 1983.

[51] Int. Cl.$^3$ ............................................. C08F 283/04
[52] U.S. Cl. ..................................... 525/426; 524/730; 528/288; 528/291; 528/298; 528/303
[58] Field of Search .......................... 525/426; 524/730; 528/288, 291, 303, 298

[56] References Cited

U.S. PATENT DOCUMENTS

| | | |
|---|---|---|
| 3,445,482 | 5/1969 | Schmerling ..................... 528/303 X |
| 3,660,521 | 5/1972 | Dann et al. ..................... 528/298 X |
| 3,745,149 | 7/1973 | Serafini et al. ..................... 528/288 |
| 4,409,371 | 10/1983 | Hefner, Jr. . |
| 4,410,686 | 10/1983 | Hefner, Jr. . |

FOREIGN PATENT DOCUMENTS 1195902  6/1970  United Kingdom .

Primary Examiner—Lucille M. Phynes

[57] ABSTRACT

A new class of polyesteramides having improved properties is the reaction product of a polyol, an alkanolamine, a polycarboxylic acid and a norbornyl terminal group.

24 Claims, No Drawings

NORBORNYL MODIFIED POLYESTERAMIDES AND PROCESS FOR PREPARING SAME

CROSS-REFERENCE TO RELATED APPLICATION

This is a continuation of application Ser. No. 465,727, filed Feb. 11, 1983.

BACKGROUND OF THE INVENTION

Unsaturated polyesters and polyamides are two classes of materials useful in the fabrication of a wide variety of products. By varying the starting monomers, some can be made spinnable into fibers and filaments; some are useful in casting; some are moldable; still others can be formulated into coatings. The physical and chemical properties can be changed through choice of monomers, polymerization procedures and other means. None are without one or more deficiencies, however.

More recently, a class of polyesteramides has been developed. Basically, those materials have been the random interpolymerization of a dicarboxylic acid with a diol and a diamine. The products have exhibited a spectrum of properties substantially different from either polyesters or polyamides.

Also recently, polyesters have been modified with dicyclopentadiene to result in products having reduced shrinkage upon curing, enhanced hydrophobicity and better economics than the corresponding unmodified polyesters.

Although all of those materials have been useful in making products acceptable in the marketplace, there is room for considerable improvement in many of their properties.

SUMMARY OF THE INVENTION

This invention provides a new class of modified polyesteramides having an improved spectrum of properties. The polyesteramides have at least one terminal group that is a norbornyl radical and a central esteramide chain prepared from an alkanolamine, a polyol and a polycarboxylic acid.

DETAILED DESCRIPTION OF THE INVENTION

The new polyesteramides have a central esteramide chain and have at least one terminal norbornyl radical. The central ester amide chain is composed of the polymerizate of an alkanolamine, a polyol, an unsaturated polycarboxylic acid and optionally, a diamine.

The useful alkanolamines are mono- and di-alkanolamines having the formula:

$$[H]_m-N-[R-OH]_n$$

wherein n is 1 and m is 2 or n is 2 and m is 1; R is a divalent organic radical which, when n is 2, may be the same or different. Preferably, R is an alkyl or substituted alkyl group of 2 or 3 carbon atoms. Typical alkanolamines are monoethanolamine, diethanolamine, monoisopropanolamine, diisopropanolamine and aminoethylethanolamine.

The dialkanolamines can react with the polycarboxylic acid to produce three different structures:

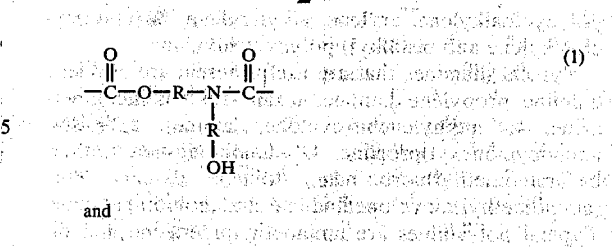

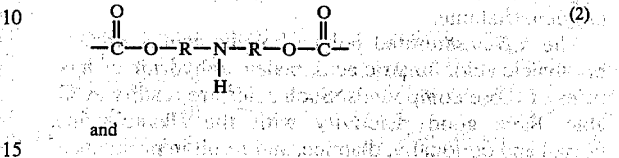

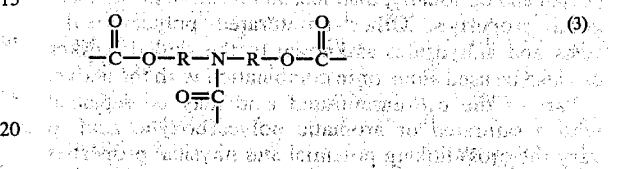

All of the structures will probably be present in a polyesteramide made with a dialkanolamine. The relative amount of the structures can be varied somewhat by adjustment of reaction stoichiometry and/or reaction time and temperature.

When a monoalkanolamine is employed, only structure (1) is present with the "ROH" substituent being hydrogen.

The polyol is from the class of those having the formula:

$$HO-R_3-OH$$

wherein $R_3$ is a divalent organic radical selected from the group consisting of alkylene, ether-linked alkylene, ether-linked arylene, cycloalkylene, polycycloalkylene, bis(alkyl)cycloalkylene, bis(alkyl)polycycloalkylene, and arylene. Mixtures of two or more of such polyols can be used.

Representative of the useful polyols are the diols such as ethylene glycol, propylene glycol, diethylene glycol, dipropylene glycol, dicyclopentadiene dimethanol, bis(hydroxymethyl)norbornane, methyl cyclohexanedimethanol, bis(hydroxypropyl)bisphenol A and other hydroxyalkylated bisphenols. Typical polyols include pentaerythritol, sorbitol, glycerine and polypropoxylated glycerine.

The ratio of alkanolamine to polyol can be varied within wide limits. That ratio is significantly related to the solubility of the modified polyesteramide in reactive diluents, such as styrene, which are commonly employed with polyesteramides for many applications.

The diamine, when used, is from the class of those having the formula:

$$HN-R_4-NH$$
$$|\quad\quad|$$
$$R_1\quad R_2$$

wherein $R_1$ and $R_2$ are independently selected from the group consisting of hydrogen, aliphatic, cycloaliphatic and aromatic radicals or $R_1$ and $R_2$ taken together with the remainder of the molecule form an aliphatic ring; and $R_4$ is a divalent organic radical selected from the group consisting of alkylene, ether-linked alkylene, ether-linked arylene, alkylene amino-linked alkylene, alkylene amino-linked cycloalkylene, cycloalkylene, polycycloalkylene, arylene, alkylarylene, bis(alkyl)cycloalkylene and bis(alkyl) polycycloalkylene.

Typical diamines that are useful herein are ethylene diamine, propylene diamine, hexane-1,6-diamine, piperazine, 4,4'-methylenebis(cyclohexylamine), 2,2'-bis(4-aminocyclohexyl)propane, 4,4'-diaminodiphenyl ether, bis(aminomethyl)norbornene, toluene diamine, bis-(aminomethyl)dicyclopentadiene and homopiperazine. Typical polyamines are aminoethylpiperazine and diethylenetriamine.

The $\alpha,\beta$-unsaturated polycarboxylic acid is preferably maleic acid, fumaric acid, maleic anhydride or mixtures of those compounds. Such acids are readily available, have good reactivity with the alkanolamine, polyol and optionally, diamine, and result in products of good properties. Other unsaturated polycarboxylic acids and anhydrides as known to the skilled worker can also be used alone or in combination with the above.

Part of the $\alpha,\beta$-unsaturated acid may be replaced with a saturated or aromatic polycarboxylic acid to vary the cross-linking potential and physical properties of the modified polyesteramide. Such acids include the aliphatic acids such as adipic acid and the aromatic acids such as isophthalic acid. Replacement of part of the $\alpha,\beta$-unsaturated acid with such acids is commonplace in the polyester art. Suitable selection of acid and amount to achieve a desired purpose will be known to the skilled worker and can be optimized with simple preliminary experiments.

The total amount of acid varies as a function of the total polyol, alkanolamine, optionally, diamine, and norbornyl ingredients used.

The terminal group used to modify the polyesteramide is a norbornyl radical. Dicyclopentadiene is a most preferred norbornyl functional material to be employed in terminating one or both ends of the chain. Polycyclopentadiene (i.e., DCPD oligomers) or dicyclopentadiene monoalcohol are also preferred species. Norbornene itself can also be used.

DCPD is sold commercially as a product of about 97 or greater percent purity. It is also sold as a $C_{10}$ hydrocarbon concentrate prepared by dimerizing a crude $C_5$ stream from the cracking of hydrocarbons as taught in U.S. Pat. No. 3,557,239. A preferred DCPD source is one that is low in peroxides and hydroperoxides and in light hydrocarbons and residual cyclopentadiene.

These concentrates have as the main reactive components about 70 to about 90 percent by weight of dicyclopentadiene, about 5 to about 30 percent by weight of the mixed Diels-Alder dimers of diolefins such as butadiene, cis- and trans-piperylene, isoprene, cyclopentadiene and methyl cyclopentadiene. The remainder of these concentrates generally comprise residual $C_5$ hydrocarbons and oligomers of the above diolefins.

Examples of some of the dimers which have been identified in these concentrates are the Diels-Alder adducts of two moles of isoprene (isoprene dimers), the adduct of cyclopentadiene and isoprene, the adduct of cyclopentadiene and piperylene, and the like.

Either the $C_{10}$ concentrate or the relatively pure DCPD may be employed in preparing the modified polyesteramides.

The modified polyesteramides can be prepared by a variety of techniques. In a preferred method, hereinafter called the "hydrolysis method," molten $\alpha,\beta$-unsaturated carboxylic anhydride is partially hydrolyzed with less than the stoichiometric equivalent of water and reacted with the norbornyl derivative to form esters of that derivative and containing unesterified acid and anhydride. This reaction may conveniently be performed in stages whereby reactants are added stepwise, thus controlling exotherms. That product mixture is then reacted with the alkanolamine, polyol and diamine, if the latter is used, to result in the desired modified polyesteramide.

In a typical procedure, molten maleic anhydride and a fraction of the stoichiometric equivalent of water is maintained at an elevated temperature of from about 60° to 130° C. The initial fractional equivalents of dicyclopentadiene (DCPD) is then added and allowed to react. A second fractional equivalent of water and of DCPD is added and allowed to react. Additional fractional equivalents of DCPD are added and each allowed to react before subsequent addition of the next increment until the desired amount of DCPD has been added.

The amount of maleic (or other) anhydride employed in this first esterification step may be equal to the equivalent of DCPD in which event the product is essentially all ester. Alternatively, the amount of anhydride may be the equivalent needed to make ester plus that excess that is to be used in the subsequent esteramidation step.

To the mixture of esterified DCPD and acid and/or anhydride is added the polyol, alkanolamine, and diamine, if used. That addition can be a bulk addition wherein all of the polyol and alkanolamine and diamine are added in one step. Alternatively, the addition can be an incremental addition wherein all of the polyol and a fractional equivalent of the alkanolamine (and optionally, diamine) are added initially and allowed to react after which subsequent increments of alkanolamine (and optionally, diamine) are added. In all instances, water is continuously removed during the esteramidation step. The timing of the remaining alkanolamine (and optionally, diamine) additions can be easily determined by the amount of water removed, by acid number or by viscosity. A convenient and practical guide is to add an alkanolamine (and optionally, diamine) increment when about one fourth to one half of the expected water from the prior addition has been collected. Incremental alkanolamine (and optionally, diamine) addition aids in the control of reaction exotherm when some alkanolamines (and optionally, diamines) are used.

After addition of the polyol and alkanolamine (and optionally, diamine) is complete, the reaction can be driven to maximum yield by maintaining or increasing the temperature until the desired acid number has been reached. Typically, acid numbers of 15 to 35 are preferred, with 15–25 most preferred. Acid numbers that are somewhat higher or lower may be tolerated, and, in some instances, may be desired for certain applications.

In an equally preferred method, hereinafter called the "prehydrolysis method," molten, $\alpha,\beta$-unsaturated carboxylic anhydride is essentially totally hydrolyzed with a stoichiometric or greater equivalent of water and reacted with the norbornyl derivative to form esters of that derivative and containing unesterified acid. This reaction may conveniently be performed in stages whereby reactants are added stepwise thus controlling reaction exotherms. That product mixture is then reacted with the polyol and alkanolamine (and optionally, diamine) to result in the desired modified polyesteramide.

In a typical procedure, molten maleic anhydride and the stoichiometric or greater equivalent of water are maintained at an elevated temperature of from about 120° to 150° C. The temperature is allowed to stabilize at about 120° to 125° C. and the initial fractional equivalent of DCPD is then added and allowed to react. A second fractional equivalent of DCPD is added and allowed to react. Additional fractional equivalents of DCPD are added and each allowed to react before subsequent addition of the next increment until the desired amount of DCPD has been added.

The amount of maleic (or other) anhydride employed in this first esterification step may be equal to the equivalent of DCPD in which event the product is essentially all monoester. Alternatively, the amount of anhydride may be the equivalent needed to make the monoester plus that excess that is to be used in the subsequent esteramidation step.

The polyol, alkanolamine, and diamine, if used, are added to the mixture of esterified DCPD and acid as described in the aforementioned hydrolysis method.

In a further modification of either the hydrolysis or prehydrolysis method, a dialkanolamine and/or a polyol containing 3 or more hydroxyl groups such as pentaerythritol may be separately added to the reaction after polyesteramidation is substantially complete. This serves to increase molecular weight and viscosity by cross-linking of the esteramide chains. Modified physical properties result from this embodiment.

In an alternate method, carbic anhydride is included in the product. In this method, called the "direct method," molten maleic anhydride and/or acid and the desired amount of DCPD are reacted at an elevated temperature to form endomethylenetetrahydrophthalic anhydride (carbic anhydride). After cooling the reaction, the unreacted maleic anhydride is hydrolyzed with less than, equal to or greater than a stoichiometric equivalent of water and reacted with the dicyclopentadiene derivative to form esterified derivatives and containing unesterified acid. This reaction may conveniently be performed in stages whereby reactants are added stepwise thus controlling reaction exotherms. That product mixture is then reacted with the polyol, alkanolamine, and diamine, if used, as earlier mentioned to result in the desired modified polyesteramide.

In a typical procedure, molten maleic anhydride and the desired amount of DCPD are maintained at an elevated temperature of from about 150° C. or higher to form endomethylenetetrahydrophthalic anhydride. The temperature is then allowed to stabilize at about 60° C. to 130° C. and a fractional equivalent of water is added. A fractional equivalent of DCPD is added and allowed to react. A second fractional equivalent of water and of DCPD is added and allowed to react. Additional fractional equivalents of DCPD are added and each allowed to react before subsequent addition to the next increment until the desired amount of DCPD has been added.

Many other alternate methods will be recognized by the skilled worker. For example, molten maleic anhydride may be added to a mixture of DCPD and water maintained in a reactor. The polyol and alkanolamine are added to the mixture of esterified DCPD and acid and/or anhydride as before. Finally, although less preferred, DCPD, maleic anhydride, water, glycol, and none, all or part of the alkanolamine may be simultaneously reacted.

An alternate method, hereinafter called the "half ester method," for preparing the modified polyesteramides, involves preparing the central esteramide chain and subsequently capping at least one end of that chain with the norbornene derivative. Water is not used in this method. In a typical procedure, an $\alpha,\beta$-unsaturated dicarboxylic anhydride, a glycol and an alkanolamine are reacted at an elevated temperature of about 130° to 150° C. with removal of water. After substantial completion of that reaction, a fraction of the norbornyl derivative, such as DCPD, is added and reacted at elevated temperature. That is followed by additional increments of DCPD with each succeeding increment added after substantial completion of the reaction of the preceding increment. After all DCPD additions are complete, reaction is continued at 200° C. with continual removal of water until the desired acid number is reached.

As is common in the unsaturated polyester and polyesteramide art, the modified polyesteramides of this invention may be blended with a monomer that is compatible therewith. Typical of the vinyl monomers are the alkenyl aromatics, such as styrene or vinyltoluene. Acrylic monomers, although less preferred, may also be used separately or in conjunction with the vinyl monomer. Typical of the acrylic monomers is dicyclopentadiene acrylate. Other useful vinyl monomers will be known to the skilled worker. The vinyl monomer, frequently called a reactive diluent, may be employed within a wide range of concentration of from about 20 to 80 percent of diluent to 80 to 20 percent of the resin. The optimum amount will depend in large measure on the polyesteramide, the diluent and the properties desired in the uncured and the cured states. Reactive diluents are employed principally to adjust the viscosity of a resin blend to permit its facile use in a given fabrication procedure. A coating formulation will usually require a lower viscosity than a molding formulation.

Other additives that are conventional in the polyester and polyesteramide art may also be included in formulations based upon these modified polyesteramides. Thus, fillers, pigments and other colorants, reinforcing fibers, and other additives may be added to serve their intended function.

The polyesteramides are curable by known catalyst systems. Peroxides, such as methyl ethyl ketone peroxides, can be used with or without known promoters, such as cobalt octoate or cobalt naphthenate, that function with such peroxides. Acyl peroxides, such as benzoyl peroxides can be used with or without promoters such as tertiary amines, including typically dimethyl aniline and N,N-dimethyl-p-toluidine. The concentrations of catalyst and promoter are adjusted within known limits of from about 0.1 to 3.0 weight percent depending on the rate of cure desired, the magnitude of the generated exotherm and for other known purposes. Known gelation retarding agents, such as p-benzoquinone, can be employed in the curing system.

The modified polyesteramides have properties that make them well adapted for coating, casting, lamination, molding, filament winding and other known fabrication procedures. A preferred use is in glass fiber laminates. The compositions prepared from the polyesteramides form articles that are especially useful in corrosive environments, high temperature environments or in some electrical insulating applications, such as encapsulation of electrical components.

The compositions and process of the invention are illustrated in the following examples wherein all parts and percentages are by weight.

EXAMPLES 1-9

Several polyesteramides were prepared from 2.0 moles of maleic anhydride, 1.2 moles of DCPD concentrate, 1.4 moles of water, and varying amounts of propylene glycol and mono-, di- or tri-alkanolamine, as shown in Table I. The DCPD concentrate contained 83.94 percent of DCPD; 14.41 percent of codimers; 1.11 percent of lights and 0.55 percent of cyclopentadiene.

Examples 1, 3 through 6, 8 and 9 employed bulk alkanolamine addition; Examples 2, 7 and 8 used incremental addition.

The procedure was the hydrolysis method involving three steps, viz: (a) a hydrolysis step consisting of the reaction of a norbornyl functional reactant plus maleic anhydride (MA), and water, (b) a diol/alkanolamine addition step, (c) a polyesteramidation step. Specifically, the reaction was performed as follows:

Hydrolysis Step

Maleic anhydride (MA) was charged to a reactor and melted to a clear, stirred solution at 70° C. A nitrogen atmosphere was continually maintained in the reactor. To this, 1.05 m of water was added followed by 0.3 m of DCPD after two minutes. Twenty minutes later, 0.3 m DCPD and 0.35 m of water were added to the reactor. After 15 more minutes, 0.3 m DCPD was charged to the reactor. The final 0.3 m DCPD was added 15 minutes later and the reactor was heated to 110° C. and held for 30 minutes of reaction.

Diol/Alkanolamine Addition Step

Two different modes of addition of the diol/alkanolamine components were used. In the *bulk alkanolamine addition method*, the total required diol/alkanolamine stoichiometry was added to the reactor followed by heating to 160° C. and removal of water via a steam condenser—Dean Stark trap—cold water condenser assembly, and increased nitrogen sparging. A total reaction time of 2 hours was used at the 160° C. temperature.

In the *incremental alkanolamine addition method*, the total diol stoichiometry plus some fraction of the alkanolamine stoichiometry were added to the reactor, followed by incremental additions of the remaining alkanolamine requirement as a function of continuing reaction (conversion). As a specific example, in Example 2, 1.04 m of propylene glycol (PG) containing 0.173 m of monoethanolamine was initially added to the reaction. After approximately ¼ of the expected water of the reaction was removed, a second increment of alkanolamine (0.173 m) was added. This was followed by a third and final incremental addition of alkanolamine (0.173 m) after approximately ½ of the expected water of the reaction was removed.

Polyesteramidation Step

The reaction temperature was increased to 205° C. and water was continually removed until the desired final acid number was attained. Acid numbers of 15 to 35 are preferred. The reaction was cooled to 160° C. and 100 ppm of hydroquinone was added as an inhibitor.

A portion of each DCPD modified unsaturated polyesteramide (199.5 g) was formulated with styrene (150.5 g) to provide 57.0 percent of resin solutions. Each solution was used to determine the Brookfield viscosity (25° C.), SPI (84° C.) gel and cure times, maximum exotherm, and clear, unfilled castings were prepared for use in mechanical property evaluations. A cure system of 1.0 percent benzoyl peroxide and 0.01 percent N,N-dimethylaniline was used at room temperature (25° C.), followed by post-curing for 2 hours at 200° F. (93° C.). Tensile test pieces (8) and flexural test pieces (6) were prepared from the clear, unfilled casting and tested used and Instron machine with standard methods (ASTM D-638 and D-790). A pair of heat distortion temperature test pieces were prepared from the clear, unfilled casting and tested using an Aminco Plastic Deflection Tester (American Instrument Co.) with standard methods (ASTM D-648). All Barcol hardness values are on the 934-1 scale. The results are shown in Table I.

COMPARATIVE EXAMPLE C-1

A DCPD modified unsaturated polyester was prepared using the above method except that only the glycol reactant (no alkanolamine) was used. Example C-1 employed 1.56 moles propylene glycol. A portion of the DCPD modified unsaturated polyester (199.5 g) was formulated with styrene (150.5 g) to provide a 57.0, 43.0 percent solution. The physical and mechanical properties were evaluated using the method of Examples 1-9. The results are shown in Table I.

In Table I the following abbreviations are used:
MA = maleic anhydride
DCPD = dicyclopentadiene
PG = propylene glycol
MEA = monoethanolamine
DEA = diethanolamine
TEA = triethanolamine.

TABLE I

| Example | PG (mole) | Alkanolamine (mole) | Final Acid Number | Brookfield Viscosity (Pa·s) | HDT (°C.) | SPI Gel Test 84° C. - 43% Styrene Gel Time (min) | Cure Time (min) | Max. Exotherm (°C.) | Ave. Barcol Hardness | Tensile Strength (psi) × 10³ [KPa·s × 10⁴] | Elongation % | Flexural Strength (psi) × 10³ [KPa·s × 10⁴] |
|---|---|---|---|---|---|---|---|---|---|---|---|---|
| 1 | 1.04 | MEA (0.520) | 34.1 | 0.103 | 86.7 | 1.9 | 3.5 | 173 | 45.1 | 4.086 [2.815] | 0.99 | 11.122 [7.663] |
| 2 | 1.04 | MEA (0.520) | 34.9 | 0.187 | 106.6 | 1.7 | 3.3 | 233 | 45.8 | 3.982 [2.744] | 0.89 | 12.401 [8.544] |
| 3 | 0.78 | MEA (0.78) | 34.0 | 0.725 | 101.1 | 1.2 | 3.4 | 172 | 46.5 | 5.981 [4.121] | 1.41 | 10.699 [7.372] |
| 4 | 1.04 | DEA (0.520) | 34.8 | 0.750 | 103.9 | 2.0 | 4.2 | 210 | 48.3 | 4.043 [2.786] | 0.84 | 14.246 [9.815] |
| 5 | 0.975 | DEA (0.520) | 37.4 | 0.552 | 103.9 | 2.3 | 4.7 | 209 | 48.6 | 4.407 [3.036] | 0.97 | 13.170 [9.074] |
| 6 | 0.78 | DEA (0.520) | (solidified below acid number 47.0) | | | | | | | | | |
| 7 | 1.04 | DEA | 32.1 | 0.830 | 98.3 | 2.0 | 4.0 | 226 | 48.2 | 5.459 | 1.15 | 13.097 |

TABLE I-continued

| Example | PG (mole) | Alkanolamine (mole) | Final Acid Number | Brookfield Viscosity (Pa · s) | HDT (°C.) | SPI Gel Test 84° C. - 43% Styrene | | | Ave. Barcol Hardness | Tensile Strength (psi) × 10³ [KPa · s × 10⁴] | Elongation % | Flexural Strength (psi) × 10³ [KPa · s × 10⁴] |
|---|---|---|---|---|---|---|---|---|---|---|---|---|
| | | | | | | Gel Time (min) | Cure Time (min) | Max. Exotherm (°C.) | | | | |
| 8 | 1.04 | TEA (0.520) | (solidified to a styrene insoluble gel during polyesterification) | | | | | | | [3.761] | | [9.024] |
| 9 | 1.248 | TEA (0.520) | 34.0 | 1.265 | 94.4 | 2.6 | 4.4 | 196 | 41.1 | 3.772 [2.599] | 0.93 | 12.594 [8.677] |
| C-1* | 1.56 | NONE (0.312) | 33.2 | 0.045 | 99.4 | 5.6 | 7.1 | 156 | 48.3 | 3.117 [2.148] | 0.71 | 10.176 [7.011] |

*Not an example of the invention.

EXAMPLE 10

A polyesteramide was prepared using a higher reaction temperature in the hydrolysis step thus generating carbic anhydride. The ingredients included 2.0 moles of maleic anhydride, 1.2 moles of DCPD, 1.4 moles of water, 1.04 moles of propylene glycol and 0.520 mole of diethanolamine. The preparation used incremental addition of the diethanolamine. Specifically, the reaction was performed as follows:

Hydrolysis Step

Maleic anhydride was charged to a reactor and melted to a clear, stirred solution at 70° C. A nitrogen atmosphere was continually maintained in the reactor. To this, 1.05 m of water is added, followed by 0.3 m of DCPD after 2 minutes. The reaction temperature is increased to 105° C. and 20 minutes later, 0.3 m of DCPD and 0.35 m of water were added to the reactor. The temperature controller was then set at 140° C. After 15 more minutes, the 140° C. temperature was achieved and a third aliquot of 0.3 m of DCPD was added to the reactor. A maximum exotherm of 155° C. resulted, then the temperature controller was set at 145° C. The final 0.3 m of DCPD was added 15 minutes later and the reactor was held at 145° C. for 30 minutes of reaction.

The diol/alkanolamine addition and polyester-amidation Steps were completed using the method of Examples 1-9.

The physical and mechanical properties were evaluated using the method of Examples 1-9. The results are shown in Table II.

TABLE II

| Example | Final Acid Number | Brookfield Viscosity (Pa · s) | HDT (°C.) | SPI Gel Test 84° C. - 43% Styrene | | Max. Exotherm (°C.) |
|---|---|---|---|---|---|---|
| | | | | Gel Time (min) | Cure Time (min) | |
| 10 | 34.0 | 0.955 | 101.7 | 1.8 | 3.1 | 224 |

| Example | Ave. Barcol Hardness | Tensile Strength (psi) × 10³ [KPa · s × 10⁴] | Elongation % | Flexural Strength (psi) × 10³ [KPa · s × 10⁴] |
|---|---|---|---|---|
| 10 | 44.4 | 4.936 [3.401] | 0.99 | 12.255 [8.444] |

EXAMPLE 11

Corrosion resistance testing of the polyesteramides of Examples 2 and 3 is shown in Table III. All changes are in percent of original. Corrosion resistance testing of these polyesteramides was accelerated at 50° C. for a total of 148 hours, unless damage necessitated earlier removal. All of the polyesteramides were tested as clear, unfilled castings of 1.5×1.0×0.165 inch dimensions. A cure system of 1.0 percent benzoyl peroxide and 0.01 percent N,N-dimethylaniline was used at room temperature followed by post-curing for 2.0 hours at 93° C. (200° F.). Twenty-four hours of sample recovery in open room temperature air was allowed prior to measurement of weight and Barcol hardness of the exposed test samples.

TABLE III

| | DI Water | | Toluene | | 5% NaOH | | 25% Sulfuric Acid | |
|---|---|---|---|---|---|---|---|---|
| Example | Change Barcol | Change Weight | Change Barcol | Change Weight | Change Barcol | Change Weight | Change Barcol | Change Weight |
| 2 | −0.21 | +0.47 | (1) | | −10.08 | −0.02 | +2.52 | +0.32 |
| 3 | −4.57 | +0.63 | (2) | | −15.18 | −0.57 | −0.42 | +0.42 |

(1) Two corner fractures after 28.75 hours.
(2) Results after 21.3 hours are moderate edge attack. Results after 28.8 hours are pitting and severe edge attack.

EXAMPLE 12

The average molecular weights of the DCPD modified unsaturated polyesteramide of Example 4 and the DCPD modified unsaturated polyester of Comparative Example 1 were determined by gel permeation chromatography. Polystyrene standards were used for reference. The polyesteramide had an average molecular weight of 5481 while the average molecular weight of the polyester was 1553.

EXAMPLE 13

A portion of the dicyclopentadiene modified unsaturated polyesteramide of Example 7 (37.05 g) and styrene (27.95 g) were formulated to provide a 57.0 percent solution of resin. This solution was used to prepare a 0.0625 inch clear, unfilled casting to have the following measurements: 6.5 inches length, 0.625 inch width at tab ends, routed to a 0.400 inch width at center. The test piece was used for plane strain compression testing with applied tension using the methods of P. B. Bowden and J. A. Jukes reported in "Journal of Material Science" 3, 183 (1968) and 7, 52 (1972). Sample cross-sectional area was 0.025 square inch and tensile load was increased by 564 psi (3.89 KPa.s×$10^4$) increments. The creep rate taken as yield was approximately 0.002 inch per minute. Tension (psi) versus compression (psi) yield point values thus obtained were plotted. Tensile and compression yield strength values were determined by extrapolation of the plotted biaxial yield line. Ductility was calculated as the ratio of compression at break to the compressive yield strength and then that value was subtracted from one. Alternately, ductility may be calculated as the ratio of tension at break to tensile yield strength. The results are shown in Table IV.

COMPARATIVE EXAMPLE C-2

A portion of the dicyclopentadiene modified unsaturated polyester of Comparative Example C-1 (37.05 g) and styrene (27.95 g) were formulated to provide a 57.0 percent resin solution. This solution was used to prepare a clear, unfilled casting using the method of Example 13. Plane strain compression testing with applied tension was completed using the method of Example 13. The results are shown in Table IV.

COMPARATIVE EXAMPLE C-2

Maleic anhydride (7.00 m, 686.42 g) was added to a reactor and heated to a 100° C. stirred solution maintained under a nitrogen atmosphere. Water (7.10 m, 127.95 g) was added, inducing a maximum exotherm of 135° C. 1 minute later. Fifteen minutes after the water addition, the reactor was air cooled to 121° C. and dicyclopentadiene (2.10 m, 277.64 g) [97 percent purity] was added. A maximum exotherm of 125° C. resulted 2 minutes later. Air cooling reduced the reactor temperature to 120° C. A second aliquot of DCPD (2.10 m, 277.64 g) was added 15 minutes after the initial DCPD addition. Fifteen minutes later, a final aliquot of DCPD (2.10 m, 277.64 g) was added and the 120° C. reaction temperature was reachieved 3 minutes later. After 30 minutes, propylene glycol (3.78 m, 187.66 g) [industrial grade] and piperazine (0.420 m, 36.18 g) [anhydrous] were added to the reactor and the steam condenser was started, nitrogen sparging was increased to 0.75 LPM, and the temperature controller was set at 160° C. The 160° C. temperature was reached 17 minutes later. After 2.0 hours at 160° C., the temperature controller was set at 205° C. and this temperature was achieved 27 minutes later. After 14.0 hours, a total of 159.5 mls of water layer and 26 mls of organic material were collected in the Dean Stark trap. The reaction was cooled to 168° C. and 100 ppm of hydroquinone were added. The modified polyesteramide alkyd was recovered as a transparent, light yellow-colored solid with a final acid number of 18.8.

A portion of the dicyclopentadiene modified unsaturated polyesteramide (37.05 g) and styrene (27.95 g) were formulated to provide a 57.0 percent resin solution. This solution was used to prepare a clear, unfilled casting using the method of Example 13. Plane strain compression testing with applied tension was completed using the method of Example 13. The results are shown in Table IV.

TABLE IV

| | Example 7 | Comparative Example C-2* | Comparative Example C-3* |
|---|---|---|---|
| Ductility | 0.360 | 0.169 | 0.060 |
| Tension at Break (psi) | 5,114 | 2,381 | 919 |
| [KPa · s $10^4$] | [3.526] | [1.642] | [0.634] |
| Compression at Break (psi) | 12,465 | 16,261 | 18,515 |
| [KPa · s × $10^4$] | [8.595] | [11.212] | [12.766] |
| Tensile Yield Strength (psi) | 14,400 | (1) | (1) |
| [KPa · s × $10^4$] | [9.929] | | |
| Compressive Yield Strength (psi) | 19,471 | 19,568 | 19,697 |
| [KPa · s × $10^4$] | [13.425] | [13.492] | [13.581] |

*Not an example of the invention.
(1) Cannot be extrapolated accurately with data points collected.

What is claimed is:

1. A norbornyl modified unsaturated polyesteramide composed of
(A) a central esteramide chain which is the reaction product of a polyol, a monoalkanolamine, a dialkanolamine or mixture thereof, a polycarboxylic acid and, optionally, a diamine, said esteramide chain containing essentially units of the formula:
(a)

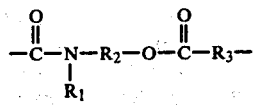

wherein $R_1$ is selected from the group consisting of hydrogen, aliphatic, cycloaliphatic and aromatic radicals and $R_2$ is a divalent organic radical selected from the group consisting of alkylene, ether-linked alkylene, ether-linked arylene, alkylene amino-linked alkylene, alkylene amino-linked cycloalkylene, cycloalkylene, polycycloalkylene, arylene, alkylarylene bis(alkyl)cycloalkylene and bis(alkyl)polycycloalkylene, and at least a part of $R_3$ is olefinically unsaturated with any remainder being aliphatic, cycloaliphatic or aromatic; and
(b) diester groups of the formula:

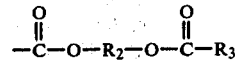

wherein $R_2$ is a divalent organic radical as previously defined or alkylene amido-linked alkylene and alkylene amido-linked cycloalkylene; $R_3$ is as previously defined; and
(c) optionally diamine groups of the formula:

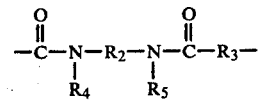

wherein $R_4$ and $R_5$ are independently selected from the group consisting of hydrogen, aliphatic, cycloaliphatic and aromatic; $R_2$ and $R_3$ are as previously defined; and
(B) at least one terminal group of said polyesteramide being a norbornyl radical.

2. The polyesteramide claimed in claim 1 wherein the units (a) are monoamidomonesters from monoethanolamine.

3. The polyesteramide claimed in claim 1 wherein the units (a) are monoamidomonoesters from diethanolamine.

4. The polyesteramide claimed in claim 1 wherein the units (a) are monoamidomonoesters from isopropanolamine.

5. The polyesteramide claimed in claim 1 wherein the units (a) are monoamidomonoesters from aminoethylethanolamine.

6. The polyesteramide claimed in claim 1 wherein the diesters (b) are from an alkylene glycol.

7. The polyesteramide of claim 6 wherein said alkylene glycol is ethylene glycol.

8. The polyesteramide of claim 6 wherein said alkylene glycol is propylene glycol.

9. The polyesteramide of claim 6 wherein said alkylene glycol is diethylene glycol.

10. The polyesteramide of claim 1 wherein the ester and amide groups are formed from an unsaturated polycarboxylic acid or a mixture of saturated or aromatic and unsaturated polycarboxylic acids.

11. The polyesteramide of claim 10 wherein the unsaturated polycarboxylic acid is a dicarboxylic acid.

12. The polyesteramide of claim 11 wherein said dicarboxylic acid is maleic acid.

13. The polyesteramide of claim 11 wherein said dicarboxylic acid is carbic acid.

14. The polyesteramide of claim 1 wherein said norbornyl radical is dicyclopentadienyl.

15. The polyesteramide of claim 14 wherein said dicyclopentadienyl radical is from a dicyclopentadiene concentrate containing Diels-Alder dimers and codimers of diolefins.

16. The polyesteramide of claim 1 wherein said norbornyl radical is from polycyclopentadiene.

17. The polyesteramide of claim 1 containing hydroquinone inhibitor.

18. A formulation of the polyesteramide of claim 1 and an unsaturated monomer.

19. The formulation of claim 18 wherein said unsaturated monomer is styrene.

20. A formulation of the polyesteramide of claim 1 and a reinforcing agent.

21. The formulation of claim 21 wherein said reinforcing agent is glass fibers.

22. A cured composition of claim 19.

23. A cured composition of claim 20.

24. A cured composition of claim 21.

* * * * *

UNITED STATES PATENT AND TRADEMARK OFFICE
CERTIFICATE OF CORRECTION

PATENT NO. : 4,471,101
DATED : September 11, 1984
INVENTOR(S) : Robert E. Hefner, Jr. et al.

It is certified that error appears in the above—identified patent and that said Letters Patent is hereby corrected as shown below:

Col. 1, line 20, "deficiences" should read --deficiencies--.

Col. 5, line 52, "addition to" should read --addition of--.

Col. 8, line 25, "used and" should read --using an--.

Col. 11, line 26, "COMPARATIVE EXAMPLE C-2" should read --COMPARATIVE EXAMPLE C-3--.

Col. 11, line 51, "reaction" should read --reactor--.

Col. 12, line 41, "alkyiarylene" should read --alkylarylene--.

Col. 13, Claim 2, line 2, "monoamidomonesters" should read --monoamidomonoesters--.

Signed and Sealed this

Thirtieth Day of April 1985

[SEAL]

Attest:

DONALD J. QUIGG

Attesting Officer

Acting Commissioner of Patents and Trademarks